(12) United States Patent
Lee

(10) Patent No.: US 12,727,455 B2
(45) Date of Patent: Sep. 1, 2026

(54) HIGH VOLTAGE SEMICONDUCTOR DEVICE INCLUDING ISOLATION REGION

(71) Applicant: DB HiTek Co., Ltd., Bucheon-si (KR)

(72) Inventor: Sung Hoon Lee, Cheongju-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 395 days.

(21) Appl. No.: 18/402,274

(22) Filed: Jan. 2, 2024

(65) Prior Publication Data

US 2025/0149376 A1 May 8, 2025

(30) Foreign Application Priority Data

Nov. 8, 2023 (KR) ........................ 10-2023-0153708

(51) Int. Cl.
*H10W 10/17* (2026.01)
*H10D 30/65* (2025.01)
*H10W 10/00* (2026.01)

(52) U.S. Cl.
CPC ............ *H10W 10/17* (2026.01); *H10D 30/65* (2025.01); *H10W 10/0145* (2026.01)

(58) Field of Classification Search
CPC ............. H10W 10/17; H10W 10/0145; H10W 10/021; H10W 10/014; H10W 10/20; H10D 30/65; H10D 30/603; H10D 62/115; H10D 30/0281; H10D 84/0188
See application file for complete search history.

(56) References Cited

U.S. PATENT DOCUMENTS 11,121,253 B2 * 9/2021 Chung ................. H10D 30/603
11,302,802 B2 * 4/2022 Wang ................... H10D 30/024
12,183,639 B2 * 12/2024 Kang ................. H10D 84/0151

FOREIGN PATENT DOCUMENTS

KR 10-2003-0000592 A 1/2003

OTHER PUBLICATIONS

Niclas Roxhed et al., "Tapered Deep Reactive Ion Etching: Method and Characterization", The 14th International Conference on Solid-State Sensors, Actuators and Microsystems, Jun. 10-14, 2007, pp. 493-496, Lyon, France.

* cited by examiner

*Primary Examiner* — Tan N Tran
(74) *Attorney, Agent, or Firm* — Bridgeway IP Law Group, PLLC; Jihun Kim

(57) ABSTRACT

A high voltage semiconductor device includes an isolation region, in which multiple voids are formed in the isolation region along the vertical direction of the isolation region, so that the possibility of cracks occurring in the isolation region is minimized, and thus tungsten (W), etc. is prevented from penetrating into a space created by the cracks in a subsequent process and deteriorating the breakdown voltage characteristics.

12 Claims, 8 Drawing Sheets

HIGH VOLTAGE SEMICONDUCTOR DEVICE INCLUDING ISOLATION REGION

CROSS REFERENCE TO RELATED APPLICATION

The present application claims priority to Korean Patent Application No. 10-2023-0153708, filed Nov. 8, 2023, the entire contents of which are incorporated herein for all purposes by this reference.

BACKGROUND OF THE INVENTION

Field of the Invention

The present disclosure relates to a high voltage semiconductor device including an isolation region. More particularly, the present disclosure relates to a high voltage semiconductor device including an isolation region, in which multiple voids are formed in the isolation region along the vertical direction of the isolation region, so that the possibility of cracks occurring in the isolation region is minimized, and thus tungsten (W), etc. is prevented from penetrating into a space created by the cracks in a subsequent process and deteriorating the breakdown voltage characteristics.

Description of the Related Art

BCDMOS (Bipolar-CMOS-DMOS) technology requires a high breakdown voltage of 100 V or more. In order to meet such a high voltage requirement, a deep trench isolation (DTI) region forming process is used to prevent an increase in leakage current through electrical isolation between adjacent devices.

FIG. 1 is a sectional view illustrating a conventional high voltage semiconductor device.

Hereinafter, the structure of a device isolation region 910 in the conventional high voltage semiconductor device and the problems arising therefrom will be described in detail with reference to the accompanying drawings.

Referring to FIG. 1, in the conventional high voltage semiconductor device, the device isolation region 910 extending to a predetermined depth within a substrate 901 is formed. Also, within the device isolation region 910, a void, which is a type of air gap, is formed long along the vertical direction of the device isolation region 910. Here, when an upper end portion of the void is formed at a height (or depth) adjacent to a surface of the substrate 901, there is a possibility that cracks may occur in the device isolation region 910 above the void in a subsequent process. That is, because stress is concentrated in one void within the device isolation region 910, cracks may occur along an area above the void. In this state where cracks occur in the device isolation region 910, when performing a subsequent process, such as a contact process, is performed, tungsten (W) may remain inside a space created by the cracks, resulting in a defect in the device.

To overcome the above problems, the inventors of the present disclosure have proposed a novel high voltage semiconductor device with an improved structure, which will be described in detail later.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent Application Publication No. 10-2003-0000592 "Method for manufacturing of semiconductor device with STI/DTI structure"

SUMMARY OF THE INVENTION

Accordingly, the present disclosure has been made keeping in mind the above problems occurring in the related art, and an objective of the present disclosure is to provide a high voltage semiconductor device including an isolation region, in which multiple voids are formed in the isolation region to be spaced apart from each other, so that the stress acting on the individual voids is distributed, thereby minimizing the possibility of cracks occurring in the isolation region and thus preventing deterioration of device characteristics.

Another objective of the present disclosure is to provide a high voltage semiconductor device including an isolation region, in which a trench for a DTI region is formed such that a horizontal width of inner sidewalls thereof gradually decreases as they extend downward and scallops are formed on the inner sidewalls, so that multiple voids are formed by gap-filling the trench with an insulating layer.

Another objective of the present disclosure is to provide a high voltage semiconductor device including an isolation region, in which a trench is gap-filled with an insulating layer multiple times, so that multiple voids are sequentially formed from a bottom void to a top void.

Another objective of the present disclosure is to provide a high voltage semiconductor device including an isolation region, in which multiple voids are formed in a DTI region but not in a pre-DTI region, so that the possibility of cracks occurring in a pre-DTI region is minimized.

In order to achieve the above objectives, according to one aspect of the present disclosure, there is provided a high voltage semiconductor device, including: a substrate; an isolation region disposed in the substrate; and a void defined in the isolation region. The void may include a plurality of voids defined in the isolation region.

According to another aspect of the present disclosure, each of the plurality of voids may be spaced apart from another along a vertical direction in the isolation region.

According to another aspect of the present disclosure, the isolation region may include a DTI region in which a scallop is defined on each inner sidewall of the DTI region, the DTI region extending downward from a surface of the substrate to a predetermined depth.

According to another aspect of the present disclosure, a horizontal width of the DTI region between inner sidewalls of the DTI region decreases as the inner sidewalls extend downward.

According to another aspect of the present disclosure, the isolation region may further include a pre-DTI region disposed in the substrate and on the DTI region. The plurality of voids may be defined in the DTI region.

According to another aspect of the present disclosure, the DTI region may have a trench formed by alternately performing an anisotropic etching process and an isotropic etching process, the trench having an insulating layer gap-filling the trench.

According to another aspect of the present disclosure, there is provided a high voltage semiconductor device, including: a substrate; a gate electrode disposed on the substrate; a drain region disposed in a surface side of the substrate; a source region disposed in the surface side of the substrate and spaced apart from the drain region; a body region surrounding the source region; and an isolation region in the substrate and including a plurality of voids therein.

According to another aspect of the present disclosure, the high voltage semiconductor device may further include: a first buried layer disposed in the substrate; a second buried layer disposed in the substrate and below the first buried layer; a high voltage well region connected to a side of the second buried layer; and a deep well region disposed in the substrate and on the high voltage well region, the deep well region surrounding the drain region.

According to another aspect of the present disclosure, the high voltage semiconductor device may further include: a body contact region disposed in the body region, the body contact region being disposed at a side adjacent to or in contact with the source region.

According to another aspect of the present disclosure, a scallop is defined on each inner sidewall of the isolation region and a horizontal width of the isolation region between inner sidewalls of the isolation region decreases as the inner sidewalls extend downward.

According to another aspect of the present disclosure, each of the plurality of voids may be spaced apart from another along a vertical direction in the isolation region.

According to another aspect of the present disclosure, a bottom void to a top void of the plurality of voids may be sequentially defined in a bottom insulating layer to a top insulating layer of a plurality of insulating layers, respectively, gap-filling a trench defined in the isolation region.

According to another aspect of the present disclosure, there is provided a high voltage semiconductor device, including: a substrate; and an isolation region disposed in the substrate and including a plurality of voids in the isolation region. The isolation region may be formed by: forming a width control layer on the substrate; forming a trench by alternately performing an anisotropic etching process and an isotropic etching process a predetermined number of times on the basis of a width size controlled by the width control layer; and gap-filling the trench with an insulating layer a predetermined number of times.

According to another aspect of the present disclosure, the width control layer may include a nitride layer.

According to another aspect of the present disclosure, inner sidewalls of the isolation region are inclined.

The present disclosure has the following effects by the above configuration.

By forming the multiple voids in the isolation region to be spaced apart from each other, the stress acting on the individual voids can be distributed, thereby minimizing the possibility of cracks occurring in the isolation region and thus preventing deterioration of device characteristics.

In addition, by forming the trench for the DTI region such that the horizontal width of inner sidewalls thereof gradually decreases as they extend downward and scallops are formed on the inner sidewalls, the multiple voids can be formed by gap-filling of insulating layers in the trench.

In addition, by gap-filling the trench with the insulating layer multiple times, the multiple voids can be sequentially formed from the bottom void to the top void.

In addition, by forming the multiple voids in the DTI region but not in the pre-DTI region, the possibility of cracks occurring in a pre-DTI region can be minimized.

Meanwhile, the effects of the present disclosure are not limited to those mentioned above, and other effects not mentioned above can be clearly understood from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

When a certain embodiment may be implemented differently, a specific process order may be performed differently from the described order. For example, two consecutively described processes may be performed substantially at the same time or performed in an order opposite to the described order.

Figure 2:
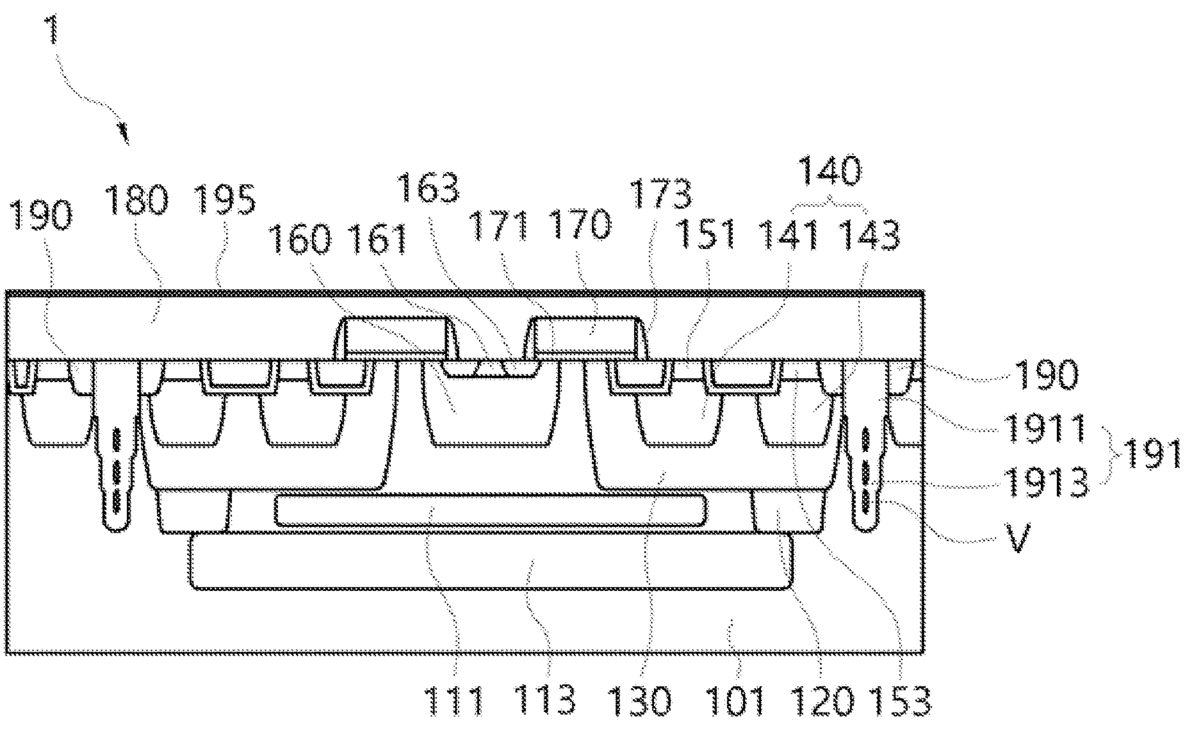
FIG. 2 is a sectional view illustrating a high voltage semiconductor device including an isolation region according to an embodiment of the present disclosure.

FIG. 2 is a sectional view illustrating a high voltage semiconductor device 1 including an isolation region 191 according to an embodiment of the present disclosure.

Hereinafter, the high voltage semiconductor device 1 according to the embodiment of the present disclosure will be described in detail with reference to the accompanying drawings.

Referring to FIG. 2, the present disclosure relates to the high voltage semiconductor device 1 including the isolation region 191. More particularly, the present disclosure relates to the high voltage semiconductor device 1 including the isolation region 191, in which multiple voids are formed in the isolation region 191 along the vertical direction of the isolation region 191, so that the possibility of cracks occurring in the isolation region 191 is minimized, and thus tungsten (W), etc. is prevented from penetrating into a space created by the cracks in a subsequent process and deteriorating the breakdown voltage characteristics.

The structure of the high voltage semiconductor device 1 according to the embodiment of the present disclosure will be described in detail. First, a substrate 101 may be formed. In the substrate 101, a well region used as an active region may be formed. This active region may be defined by an STI region 190 serving as a device isolation layer. In addition, the substrate 101 may be a substrate of first conductivity type, a P-type diffusion region disposed in a substrate, or may include a P-type epitaxial layer formed by epitaxial growth on a substrate. The STI region 190 may be formed by a shallow trench isolation (STI) process, but the present disclosure is not limited thereto. In addition, the STI region 190 may overlap with the isolation region 191, which will be described later, or may be formed in a position that is physically separate from the isolation region 191. However, the scope of the present disclosure is not limited by specific examples.

In the substrate 101, a first buried layer 111 and a second buried layer 113 may be formed. For example, the first buried layer 111 may be formed at a side above the second buried layer 113. In addition, a high voltage well region 120 may be formed to be connected to a side of the second buried layer 113. The high voltage well region 120 may be an impurity region (HVNWELL) of second conductivity type, and may be formed on the second buried layer 113 in the substrate 101. The first buried layer 111 may be an impurity region of first conductivity type, and the second buried layer 113 may be an impurity region of second conductivity type. It should be noted that the first buried layer 111 and the high voltage well region 120 are not essential components of the present disclosure and may be omitted in some cases.

In addition, a deep well region 130 may be formed on the high voltage well region 120 in the substrate 101. The deep well region 130 may have a side connected to the high voltage well region 120, and may be an impurity region (DNWELL) of second conductivity type. In some cases, the deep well region 130 may be formed to be directly connected to the second buried layer 113.

In addition, a pair of well regions 140 (141 and 143) of second conductivity type may be formed in the deep well region 130. A drain region 151 may be formed in a first well region 141, and a heavily doped region 153 may be formed in a second well region 143. The drain region 151 may be an impurity region of second conductivity type, and may be doped with a higher concentration of impurities than the first well region 141. Also, the heavily doped region 153 may be an impurity region of second conductivity type, and may be doped with a higher concentration of impurities than the second well region 143. The drain region 151 and the heavily doped region 153 may be spaced apart from each other by the STI region 190.

In addition, the drain region 151 and the heavily doped region 153 are preferably formed in a surface side of the substrate 101. The heavily doped region 153 may function as a guard ring together with the second well region 143 and the high voltage well region 120 to reduce leakage current and improve the safe operating area (SOA) of the device. The drain region 151 may be electrically connected to a drain electrode (not illustrated). The first well region 141 surrounding the drain region 151 may be a drain extension region and may improve breakdown voltage characteristics of a high voltage semiconductor device.

In addition, a body region 160 may be formed in the substrate 101. The body region 160 may be a heavily doped impurity region of first conductivity type, and may be formed to be spaced apart from or in contact with the deep well region 130. In addition, a source region 163 may be formed in the body region 160 and in the surface side of the substrate 101. The source region 163 may be a heavily doped impurity region of first conductivity type and may be electrically connected to a source electrode (not illustrated). In addition, a body contact region 161 may be formed in the body region 160 at a side adjacent to or in contact with the source region 163. The body contact region 161 may be a heavily doped impurity region of first conductivity type.

In addition, a gate electrode 170 may be formed on the substrate 101. In detail, the gate electrode 170 may be formed between the drain region 151 and the source region 163 in the active region. The gate electrode 170 may be formed on a channel region. The channel region may be turned on or off in response to a gate voltage applied to the gate electrode 170. The gate electrode 170 may be made of any one of conductive polysilicon, metal, conductive metal nitride, and a combination thereof, and may be formed by a CVD, PVD, ALD, MOALD, or MOCVD process.

In addition, a gate insulating layer 171 may be formed between the gate electrode 170 and the surface of the substrate 101. The gate insulating layer 171 may be any one of a silicon oxide layer, a high-k dielectric layer, and a combination thereof. In addition, the gate insulating layer 171 may be formed by an ALD, CVP, or PVD process.

In addition, a sidewall of the gate electrode 170 may be covered by a gate spacer 173. The gate spacer 173 may be made of any one of an oxide layer, a nitride layer, and a combination thereof.

Next, an interlayer insulating layer 180 may be formed on the substrate 101 to cover both the gate electrode 170 and the STI region 190. The interlayer insulating layer 180 may be, for example, a borophosphosilicate glass (BPSG) layer or a tetraethyl orthosilicate (TEOS) layer, but the present disclosure is not limited thereto.

Figure 3:
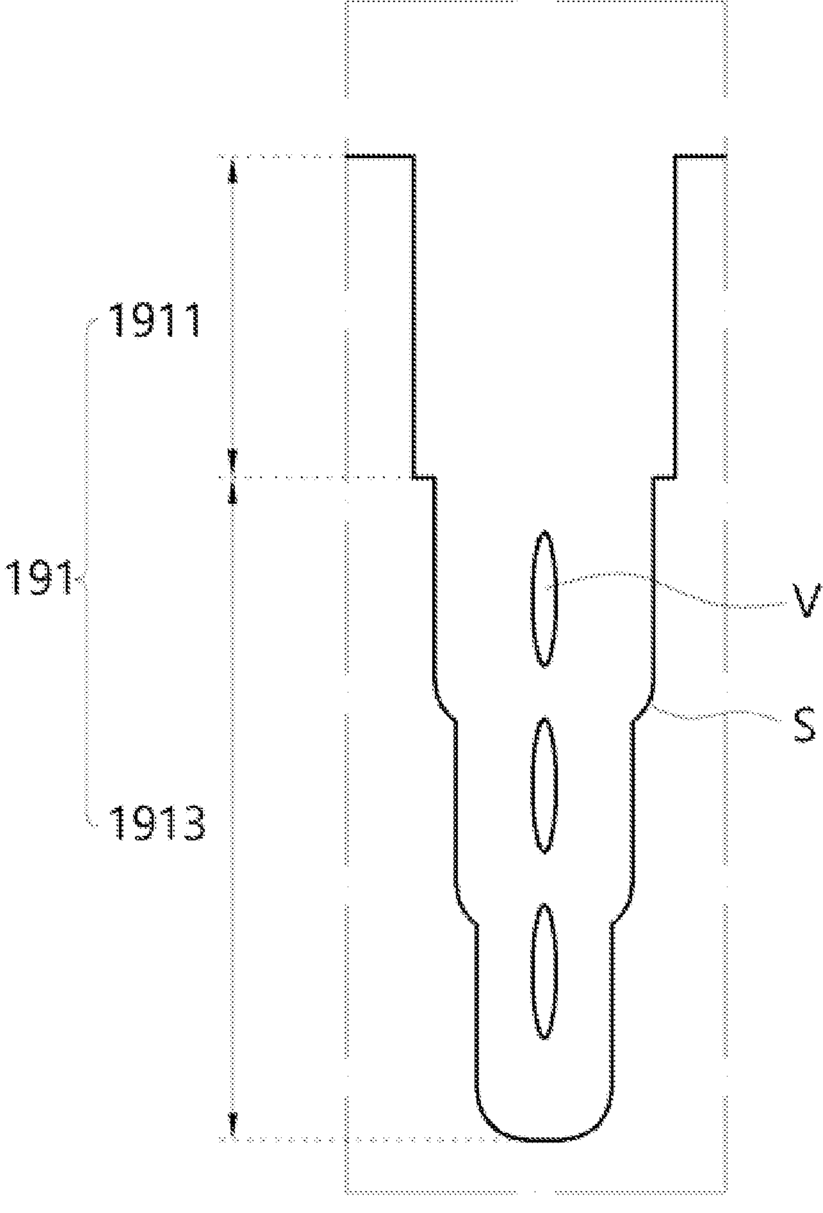
FIG. 3 is an enlarged view illustrating the isolation region illustrated in FIG. 2.

FIG. 3 is an enlarged view illustrating the isolation region 191 illustrated in FIG. 2.

Referring to FIGS. 2 and 3, the isolation region 191 may be formed in the substrate 101. The isolation region 191 may include a pre-DTI region 1911 with a relatively wide horizontal width and a DTI region 1913 with a narrow horizontal width. Here, an upper end of the DTI region 1913 may be connected to a lower end of the pre-DTI region 1911. However, the isolation region 191 may include only the DTI region 1913 in some cases. In such cases, the DTI region 1913 may be formed to extend downward from an upper surface of the substrate 101 to a predetermined depth of the substrate 101. In addition, a waterdrop-shaped scallop S extending in the vertical direction may be formed on each inner sidewall of the DTI region 1913.

When forming a trench for the DTI region 1913, an anisotropic etching process and an isotropic etching process may be alternately performed so that a horizontal width of the inner sidewalls of the DTI region 1913 gradually decreases as they extend downward and scallops S are formed on the inner sidewalls. In addition, multiple voids V may be formed in the isolation region 191 or the DTI region 1913 to be spaced apart from each other.

FIGS. 4 to 11 are reference sectional views illustrating the process of forming the isolation region 191 illustrated in FIG. 2.

Hereinafter, the process of forming the isolation region 191 including the multiple voids V will be described by way of example with reference to the accompanying drawings.

Figure 4:
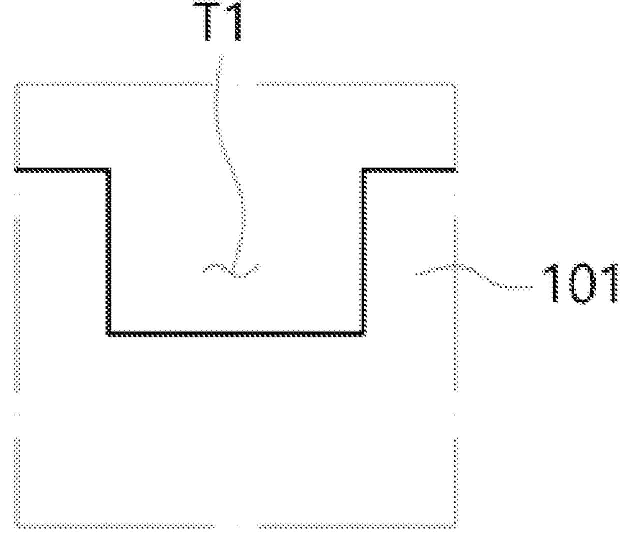
FIGS. 4 to 11 are reference sectional views illustrating the process of forming the isolation region illustrated in FIG. 2.

Referring to FIG. 4, a first trench T1 where the Pre-DTI region 1911 is to be formed may be formed by etching the substrate 101.

Figure 5:
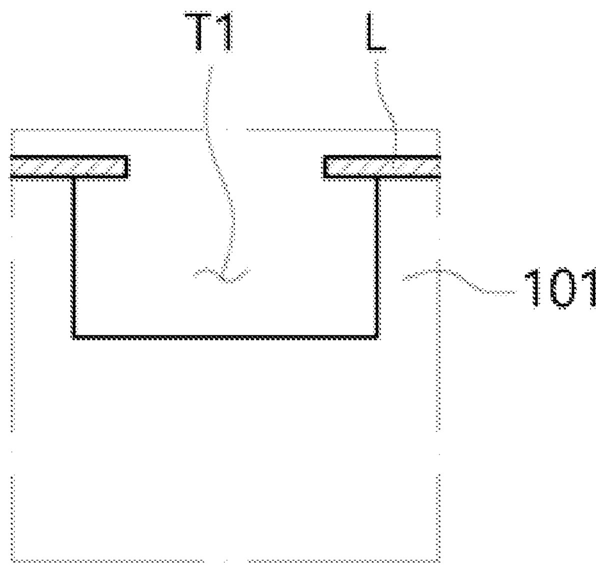

Then, referring to FIG. 5, a width control layer L may be formed on the substrate 101 at a side where the first trench T1 is formed. The width control layer L is a layer that controls the size of a trench width when forming the DTI region 1913, and may be a nitride layer, for example.

Figure 6:
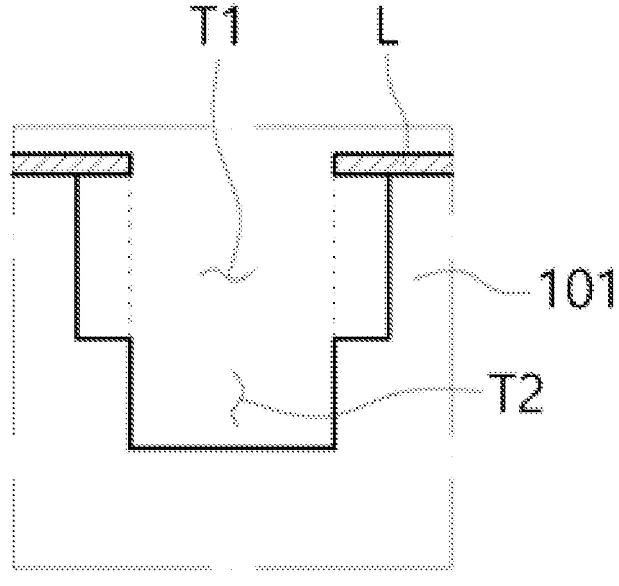
Figure 7:
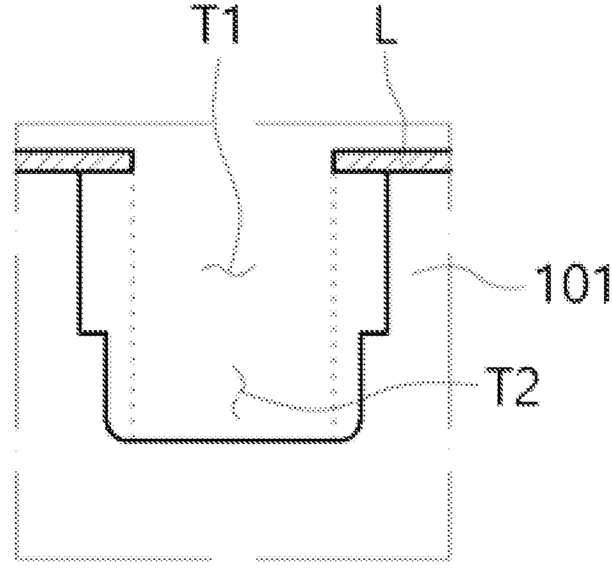
Figure 8:
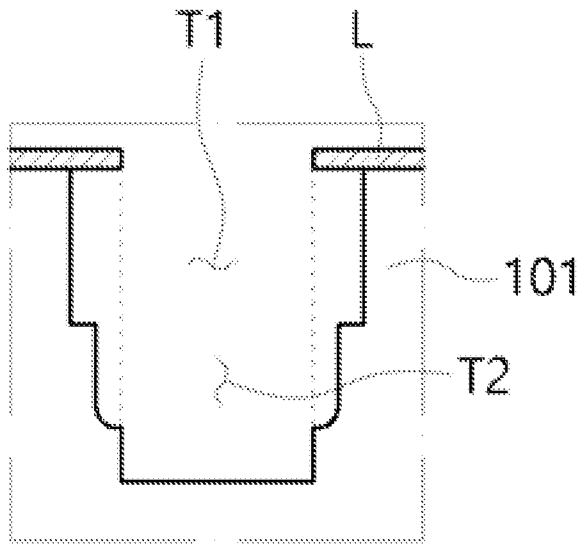
Figure 9:
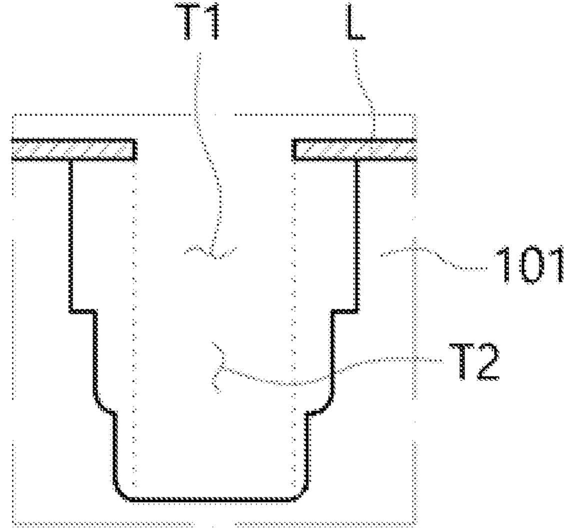

Then, referring to FIGS. 6 and 7, the substrate 101 may be etched from a bottom portion of the first trench T1 by an anisotropic etching process on the basis of a width size controlled through the width control layer L, and an isotropic etching process may be performed again to form a second trench T2. Then, referring to FIGS. 8 and 9, the substrate 101 may be etched from a bottom portion of the second trench T2 by an anisotropic etching process on the basis of a width size controlled through the width control layer L, and an isotropic etching process may be performed again. As described above, the anisotropic etching process and the isotropic etching process may be repeatedly performed until a bottom portion of the second trench T2 is formed at a predetermined depth in the substrate 101. After that, the width control layer L may be removed.

Figure 10:
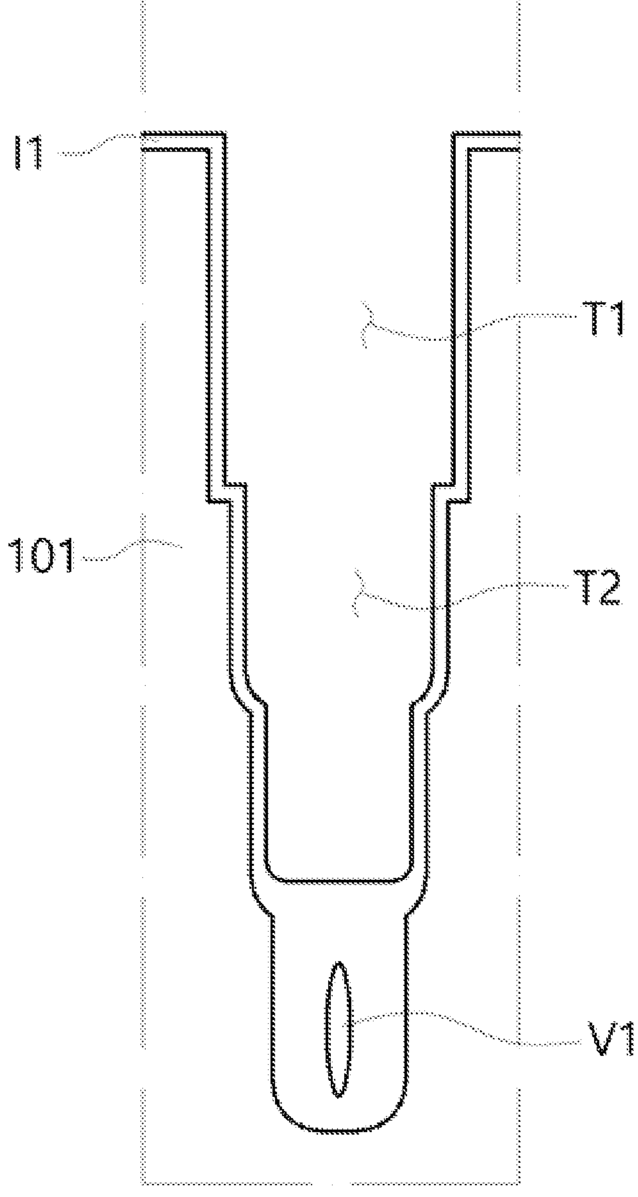
Figure 11:
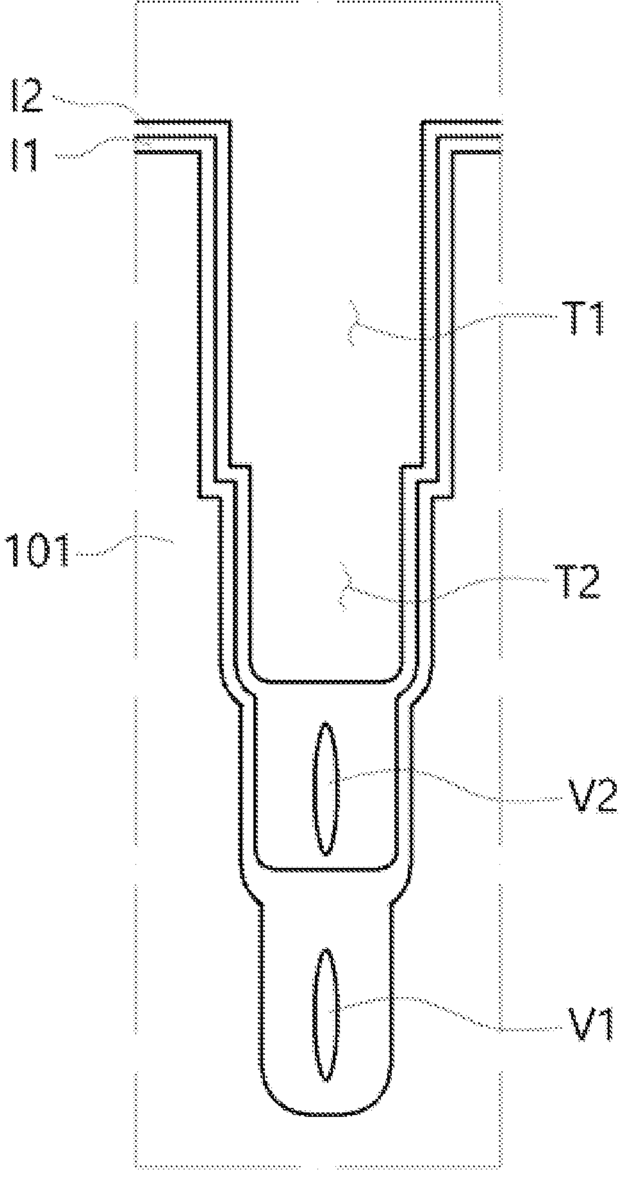

Then, referring to FIG. 10, the first trench T1 and the second trench T2 are gap-filled with a first insulating layer I1. The first insulating layer I1 may be, for example, a TEOS layer, but the present disclosure is not limited thereto. During the gap-filling of the first insulating layer I1, a first void V1 may be formed in a bottom portion of the isolation region 191. Then, referring to FIG. 11, when the first trench T1 and the second trench T2 are gap-filled with a second insulating layer 12, a second void V2 may be formed to be spaced upward apart from the first void V1. The second insulating layer 12 may also be, for example, a TEOS layer, but the present disclosure is not limited thereto. By repeating the insulating layer gap-fill process, a multiple voids V may be formed to be spaced apart from each other.

Hereinafter, the structure of a device isolation region 910 in a conventional high voltage semiconductor device and the problems arising therefrom will be described in detail with reference to the accompanying drawings.

Figure 1:
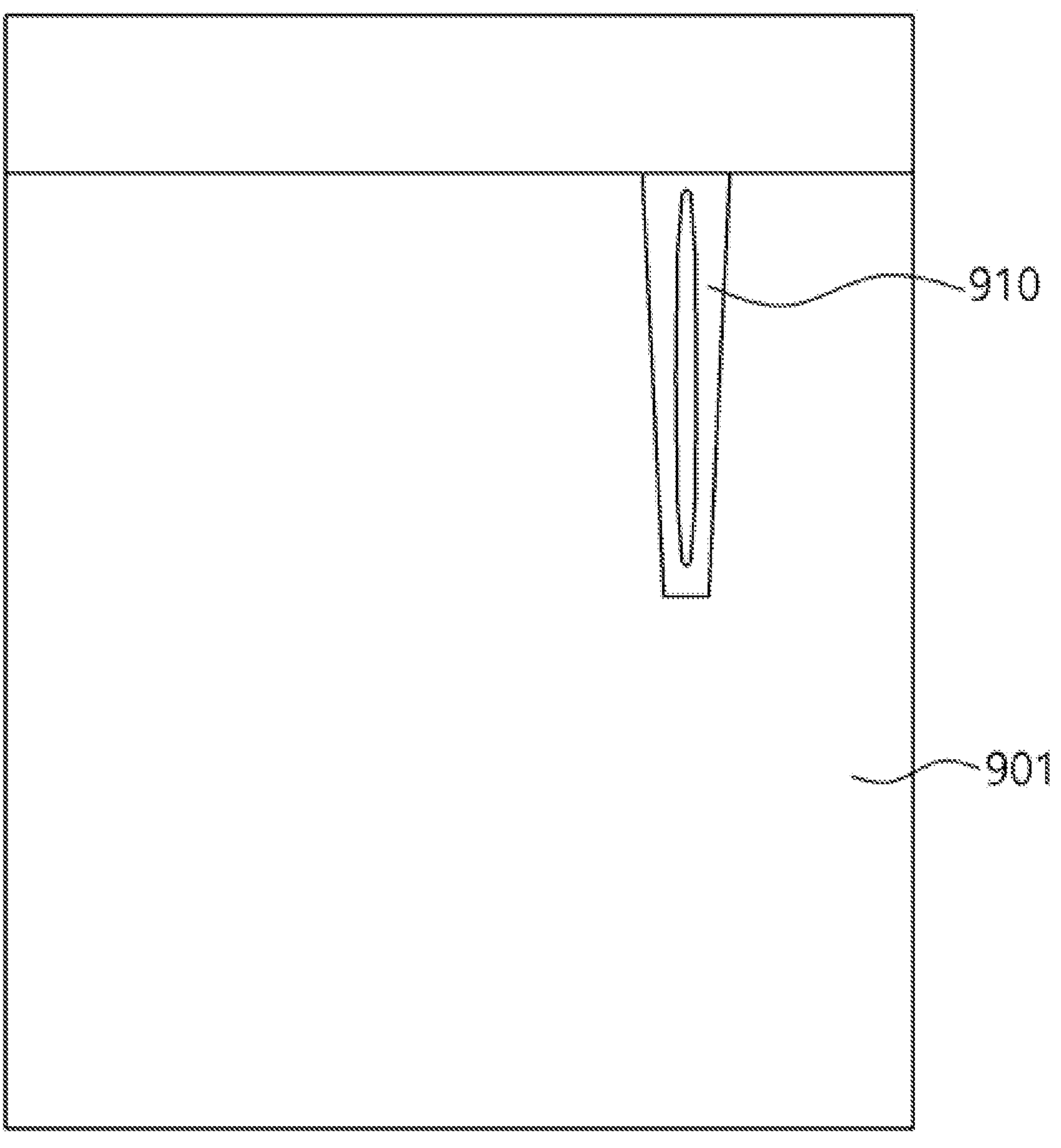
FIG. 1 is a sectional view illustrating a conventional high voltage semiconductor device.

Referring to FIG. 1, in the conventional high voltage semiconductor device, the device isolation region 910 extending to a predetermined depth within a substrate 901 is formed. Also, within the device isolation region 910, a void, which is a type of air gap, is formed long along the vertical direction of the device isolation region 910. Here, when an upper end portion of the void is formed at a height (or depth) adjacent to a surface of the substrate 901, there is a possibility that cracks may occur in the device isolation region 910 above the void in a subsequent process. That is, because stress is concentrated in one void within the device isolation region 910, cracks may occur along an area above the void. In this state where cracks occur in the device isolation region 910, when performing a subsequent process, such as a contact process, is performed, tungsten (W) may remain inside a space created by the cracks, resulting in a defect in the device.

Referring to FIGS. 2 and 3, in order to solve the above problems, the high voltage semiconductor device 1 according to the embodiment of the present disclosure is characterized in that the multiple voids V spaced apart from each other are formed in the isolation region 190. That is, a conventional single void is divided into the multiple voids V. The plurality of voids V may be formed in the isolation region 190 to be spaced apart from each other in the vertical direction. The number of the voids V formed in the isolation region 190 is not limited. By forming the multiple voids V in the isolation region 190 as described above, the stress acting on the individual voids V can be distributed compared to the conventional single void formed in a DTI region. Therefore, the possibility of cracks occurring in the isolation region 910 can be significantly reduced.

The foregoing detailed description may be merely an example of the present disclosure. Also, the inventive concept is explained by describing the preferred embodiment and will be used through various combinations, modifications, and environments. That is, the inventive concept may be amended or modified without departing from the scope of the technical idea and/or knowledge in the art. The foregoing embodiment is for illustrating the best mode for implementing the technical idea of the present disclosure, and various modifications may be made therein according to specific application fields and uses of the present disclosure. Therefore, the foregoing detailed description of the present disclosure is not intended to limit the inventive concept to the disclosed embodiment.

What is claimed is:

1. A high voltage semiconductor device, comprising:

a substrate;

an isolation region disposed in the substrate; and a plurality of voids defined in the isolation region, wherein the isolation region includes a DTI region extending downward, and each inner sidewall of the DTI region defines a plurality of scallops positioned along a downward direction, wherein a horizontal width of the DTI region at a lower scallop of the plurality of scallops is less than a horizontal width of the DTI region at an upper scallop of the plurality of scallops.

2. The high voltage semiconductor device of claim 1, wherein each of the plurality of voids is spaced apart from another along a vertical direction in the isolation region.

3. The high voltage semiconductor device of claim 2, wherein the isolation region further comprises a pre-DTI region disposed in the substrate and on the DTI region, wherein the plurality of voids is defined in the DTI region.

4. The high voltage semiconductor device of claim 2, wherein the DTI region has a trench formed by alternately performing an anisotropic etching process and an isotropic etching process, the trench having an insulating layer gap-filling the trench.

5. A high voltage semiconductor device, comprising:

a substrate;

a gate electrode disposed on the substrate;

a drain region disposed in a surface side of the substrate;

a source region disposed in the surface side of the substrate and spaced apart from the drain region;

a body region surrounding the source region; and an isolation region in the substrate and including a plurality of voids therein, wherein the isolation region includes a DTI region extending downward, and each inner sidewall of the DTI region defines a plurality of scallops positioned along a downward direction, wherein a horizontal width of the DTI region at a lower scallop of the plurality of scallops is less than a horizontal width of the DTI region at an upper scallop of the plurality of scallops.

6. The high voltage semiconductor device of claim 5, further comprising:

a first buried layer disposed in the substrate;

a second buried layer disposed in the substrate and below the first buried layer;

a high voltage well region connected to a side of the second buried layer; and a deep well region disposed in the substrate and on the high voltage well region, the deep well region surrounding the drain region.

7. The high voltage semiconductor device of claim 6, further comprising:

a body contact region disposed in the body region, the body contact region being disposed at a side adjacent to or in contact with the source region.

8. The high voltage semiconductor device of claim 6, wherein each of the plurality of voids is spaced apart from another along a vertical direction in the isolation region.

9. The high voltage semiconductor device of claim 8, wherein a bottom void to a top void of the plurality of voids are sequentially defined in a bottom insulating layer to a top insulating layer of a plurality of insulating layers, respectively, gap-filling a trench defined in the isolation region.

10. A high voltage semiconductor device, comprising:

a substrate; and an isolation region disposed in the substrate and including a plurality of voids in the isolation region, wherein the isolation region is formed by:

forming a width control layer on the substrate;

forming a trench by alternately performing an anisotropic etching process and an isotropic etching process with a predetermined number of times on a basis of a width size controlled by the width control layer; and gap-filling the trench with an insulating layer a predetermined number of times, wherein the isolation region includes a DTI region extending downward, and each inner sidewall of the DTI region defines a plurality of scallops positioned along a downward direction, wherein a horizontal width of the DTI region at a lower scallop of the plurality of scallops is less than a horizontal width of the DTI region at an upper scallop of the plurality of scallops.

11. The high voltage semiconductor device of claim 10, wherein the width control layer includes a nitride layer.

12. The high voltage semiconductor device of claim 10, wherein inner sidewalls of the isolation region are inclined.

* * * * *